United States Patent [19]

Elliott et al.

[11] Patent Number: 4,716,390
[45] Date of Patent: Dec. 29, 1987

[54] MAGNETOSTATIC WAVE CHANNELIZER

[75] Inventors: Jeffrey H. Elliott, Santa Monica; Robert B. Stokes, Torrance; David Penunuri, Placentia; Kuo-Hsiung Yen, Manhattan Beach, all of Calif.

[73] Assignee: TRW Inc., Redondo Beach, Calif.

[21] Appl. No.: 907,546

[22] Filed: Sep. 15, 1986

[51] Int. Cl.$^4$ .......................... H01P 1/20; H01P 1/213
[52] U.S. Cl. ..................................... 333/202; 333/132; 333/204; 333/245; 333/246
[58] Field of Search .................. 333/1, 103, 104, 110, 333/129, 132, 133, 148, 149, 186, 193–196, 24.1, 150–156, 161, 201, 245, 246, 24.2; 324/78 F, 80, 77 R, 77 D, 77 H, 77 J; 310/313 R, 313 A, 313 B, 313 C, 313 D, 26; 73/602

[56] References Cited

U.S. PATENT DOCUMENTS 4,499,393 2/1985 Stokes et al. ............... 310/313 R
4,614,919 9/1986 Floyd .......................... 333/186 X Primary Examiner—Marvin L. Nussbaum
Attorney, Agent, or Firm—Noel F. Heal; Robert W. Keller

[57] ABSTRACT

A magnetostatic wave (MSW) device for performing spectral analysis of an input signal containing signal components of very high frequency, well in excess of 1 GHz (gigahertz). An input transducer array couples the input signal to a magnetostatic propagating medium, such as a film of yttrium-iron-garnet (YIG), in such a manner that the array effectively provides multiple wave sources spaced along a predetermined arc on the propagating medium, and the waves combine constructively at frequency-dependent points in a focal region of the medium, spaced apart from the input array. Output transducers located at these frequency-dependent points generate output signals indicative of various selected frequency components of the input signal.

10 Claims, 11 Drawing Figures

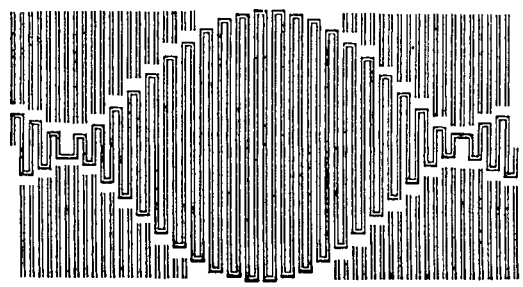
FIG. 5c
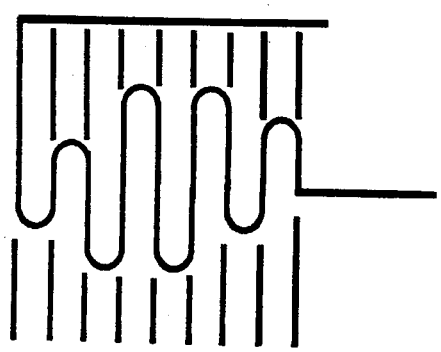
FIG. 5d
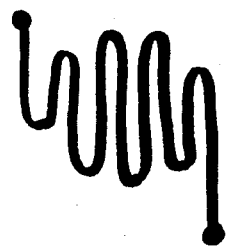
FIG. 5e  FIG. 5f

MAGNETOSTATIC WAVE CHANNELIZER

BACKGROUND OF THE INVENTION

This invention relates generally to devices for processing and analyzing high-frequency signals and, more particularly, to signal spectrum analyzers or channelizers. U.S. Pat. No. 4,541,687 issued to Brooks, discloses such a device employing surface acoustic waves and a surface acoustic wave substrate as the transmission medium.

A surface acoustic wave channelizer has an input transducer array to which a broadband input signal is applied. The input array provides, in effect, a number of point sources of acoustic wave, which, for a particular frequency, combine constructively at a predetermined point in a focal region on the substrate. Output transducers are placed on the focal region, and operate to convert the focused acoustic energy back into electrical signals at a number of different frequencies. The device operates as a spectrum analyzer or Fourier transform device, converting a single broadband input signal into multiple narrowband output signals indicative of the spectral content of the input signal.

Although the surface acoustic wave channelizer operates satisfactorily, if has a two significant limitations. First, like all surface acoustic wave devices, the surface acoustic wave channelizer operates at frequencies below 1 gigahertz (GHz). This is a limitation imposed by the velocity of propagation of the acoustic waves and by the minimum resolution obtainable in photolithographically forming the transducers of the device. Some applications require the analysis of signals at much higher frequencies than this, and the higher frequency input signal must first be down-converted to below 1 GHz before input to the channelizer. Down-converting adds complexity and cost to the analysis procedure, and it would be desirable to avoid this step if possible.

Another disadvantage of the surface acoustic wave channelizer is that surface acoustic wave substrates are anisotropic in nature. In particular, they exhibit different wave propagation velocities for different directions of propagation. These differences have to be compensated for by appropriate placement and orientation of the input transducers.

Accordingly, there is still a need for a channelizer capable of handling high frequencies, in excess of 1 GHz, directly and without the need for down-converting at the input of the device, and having a more isotropic transmission medium than the ones used in surface acoustic wave devices. The present invention satisfies this need.

SUMMARY OF THE INVENTION

The present invention resides in a diffraction-type device for performing spectral analysis of an input signal, employing magnetostatic waves for the propagation of energy from input to output in the device. Briefly, and in general terms, the device comprises a magnet ostatic wave (MSW) propagating medium, means for applying a magnetic bias field to the propagating medium, input transducer array means, and a plurality of output transducers. The input transducer array means in responsive to the input signals and provides a spatially modulated transduction coupling strength along an arcuate path on the propagating medium. The arcuate path is selected to provide multiple sources of magnetostatic waves that combine constructively at frequency-dependent points in a focal region of the propagation medium. The output transducers are positioned on the propagating medium at frequency-dependent points in the focal region, to provide output signals indicative of the various frequency components of the input signal.

In one of the disclosed embodiments of the invention, the input transducer array means includes a microstrip transmission line having alternating high and low impedance sections to provide alternating high and low coupling strength with the propagating medium. Other possible input transducer structures include a microstrip transmission line following a meandering path to achieve a spatial modulation of the coupling strength with the propagating medium.

In the illustrative embodiment of the invention, the MSW propagating medium is a thin film of yttrium-iron-garnet (YIG). The film is formed on a substrate and is placed in close proximity to the input transducer array and the output transducer. The output transducers may take various forms, including parallel microstrip sections spaced apart by fractions of a wavelength, interdigital structures, or meandering transmission lines.

It will be appreciated fron the foregoing that the present invention represents a significant advance in the field of high frequency microwave signal processing. In particular, the invention provides a technique for spectrum analysis at microwave frequencies well in excess of 1 GHz without down-converting to a lower frequency. Other aspects and advantages of the invention will become apparent from the following more detailed description, taken in conjunction with the accompanying drawings.

BRIEF DESCRIPTION OF THE DRAWINGS

FIGS. 5a-5f are plan views of alternate forms of output transducers that may be used in the structure of the invention.

DESCRIPTION OF THE PREFERRED EMBODIMENT

Figure 1:
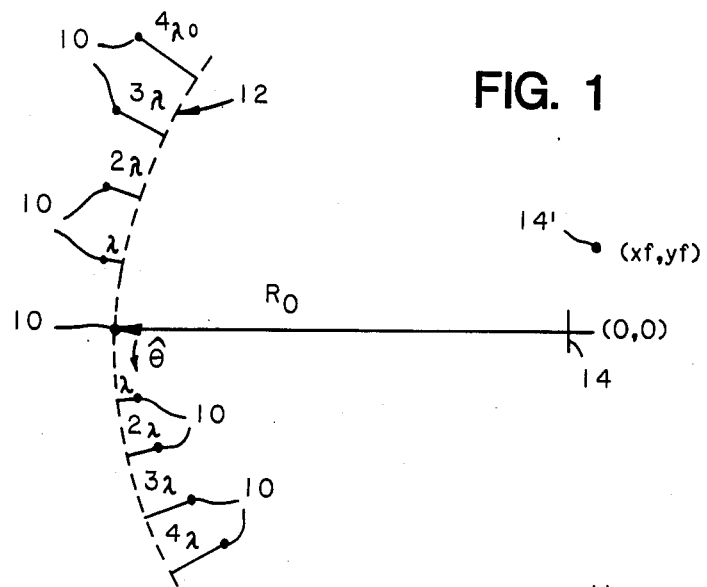
FIG. 1 is a diagrammatic plan view of a diffraction-type spectrum analyzer or channelizer, showing the positioning of ideal point-source input transducers in relation to an output focal point.

As shown in the drawings for purposes of illustration, the present invention is concerned with spectrum analyzers or channelizers, for the spectral analysis of a multi-frequency or broadband input signal. Prior to the present invention, such devices employed surface acoustic waves for energy transmission, and operated on principles of interference of acoustic waves propagating in an acoustic wave propagating medium, such as lithium niobate. Surface acoustic wave devices fabricated using presently available photolithographic techniques are limited to frequencies below 1 GHz, and the propagating medium is anisotropic to some degree.

In accordance with the present invention, a frequency channelizer is constructed using magnetostatic waves as the energy propagating phenomenon.

Magnetostatic wave (MSW) devices have been studied for some years, particularly since the development of liquid-phase epitaxial processes for the fabrication of suitable ferrimagnetic films. MSW devices depend for their operation on a principle of magnetic resonance associated with electrons in ferrimagnetic materials. According to theory, spinning electrons circulating around the nuclei of atoms forming a ferrimagnetic crystal lattice generate a strong magnetic moment that can be made to precess around the direction of an external magnetic bias field. This precession is analogous to the behavior of a gyroscope in a gravitational field. The magnetic moments can be considered as magnetic dipoles, which normally align themselves with the external magnetic bias field.

If the magnetic field is perturbed by another magnetic force acting at right-angles to the bias field, the dipoles in the region of the perturbing force precess about the direction of the bias field, at a rate depending principally on the strength of the bias field and to a lesser degree on the nature of the materials. Since adjacent dipoles are effectively coupled together, the perturbing magnetic force produces a disturbance wave that propagates through the ferrimagnetic film, which is typically of yttrium-iron-garnet (YIG) material grown on a suitable substrate. The perturbing magnetic field can be applied by means of a microstrip transmission line located in close contact with the surface of the film, to generate a radio-frequency (rf) field perpendicular to the bias field. A suitable output transducer placed in close proximity to the film at another location, can be used to convert the magnetostatic waves back into the form of an electrical signal.

The curret state of the art of MSW devices is described in a paper by Waguih S. Ishak and Kok-Wai Chang entitled "Magnetostatic-Wave Devices for Microwave Signal Processing," published in the Hewlett-Packard Journal, February 1985, pp. 10–20. As indicated in the paper, MSW devices have been used or proposed for filters, resonators, signal-to-noise enhancers, delay-line oscillators and frequency multipliers.

As shown in FIG. 1, the principle of the channelizer involves the use of multiple point sources of radiation provided by an input array, as indicated by reference numeral 10. The input sources 10 are staggered with respect to a constant group velocity curve 12, which is approximately a circular arc having a center 14 at coordinates (0,0). One of the point sources 10 is located on the curve 12, and adjacent point sources are displaced from the curve 12 by a distance $\lambda_0$ in each radial direction. The next adjacent point sources in each radial direction are displaced by $2\lambda_0$ from the curve 12, and so forth, where $\lambda_0$ is the wavelength at a nominal or center frequency of the input signal.

For input signals of wavelength $\lambda_0$, there is constructive reinforcement of the signals radiated from each of the point sources, arriving at the focus 14. For signals of another frequency f other than $f_0$, the transmissions from the input array combine constructively at another point 14', indicated by the coordinates $(x_f, y_f)$ displaced from the focal point 14. Different frequency components of the input signal have different spatially positioned focal points, and the channelizer takes advantage of this spatial separation by positioning output transducers at each of a set of focal points corresponding to frequency components of interest in the input signal.

Figure 2:
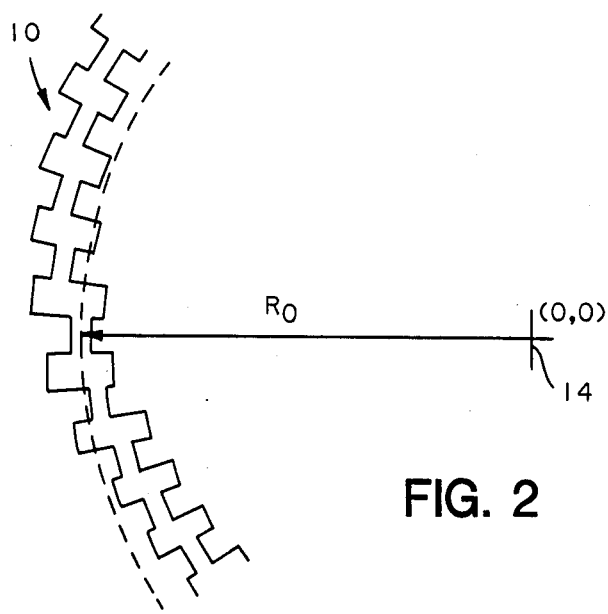
FIG. 2 is a plan view of one form of an input transducer array used in the device of the invention.

FIG. 2 shows one form that the input transducer array can taken in the MSW device of the invention. Basically the array 10 comprises a microstrip transmission line having alternately wide and narrow metallized sections. Apart from this distinguishing feature, the microstrip line is of conventional construction, in which a metallized strip is separated from a ground plane by a dielectric material, as described with reference to FIG. 3. The wide sections which have a lower impedance than the narrow sections, have a correspondingly lower rf magnetic field associated with them and do not couple electrical energy as efficiently into the device as do the narrow sections. The result is a spatially modulated transduction strength along a desired arc on the device.

Figure 3:
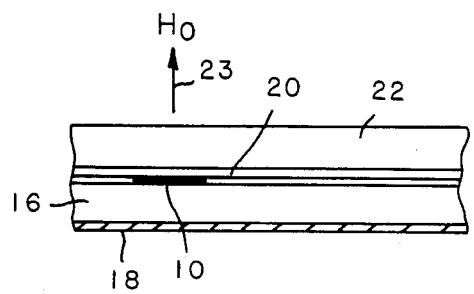
FIG. 3 is a fragmentary cross-sectional view of a device in accordance with the invention.

As shown in FIG. 3, one possible structural form of the MSW device of the invention has two basic elements: an rf input/output strcture including a dielectric substrate 16, ground plane 18, and the input array 10 in the form of a microstrip transmission line; and an MSW transmission medium including a ferrimagnetic film 20 in close proximity to the microstrip line, the film being formed on a suitable substrate 22. The ferrimagnetic film 20 in the presently preferred embodiment is of yttrium-iron-garnet (YIG), and the substrate 20 may be of gadolinium gallium garnet (GGG). Any suitable dielectric material, such as alumina, may be used for the substrate 16. A magnetic bias field is applied to the film 20, as indicated by the arrow 25. Depending on the application of the device, this bias field may be supplied by a permanent magnet positioned to provide a substantially uniform magnetic field, or may be supplied by an suitable electromagnet. Generally speaking, an electromagnet would be less costly, but requires a power supply and may not, therefore, be suitable in some environments, such as space vehicles.

Figure 4A:
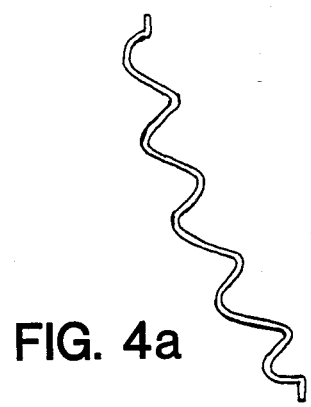
FIGS. 4a and 4b are plan views of alternate forms of a transducer input array.
Figure 4B:
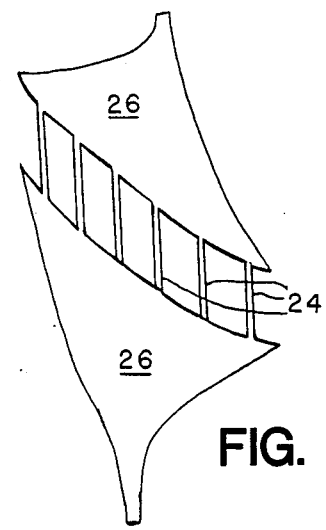

Spatial modulation of the transduction strength along the input transducer arc can be obtained by structures other than the one shown in FIG. 2. For example, a microstrip line of relatively uniform width can be made to follow a meandering path following a general direction along the desired arc, as shown diagrammatically in FIG. 4a. Another possibility is shown in FIG. 4b, in which the input array includes a grating of relatively narrow, parallel microstrip lines 24 bridging a gap between two wider metallized regions 26 to which the input rf signal is applied.

Figure 5A:
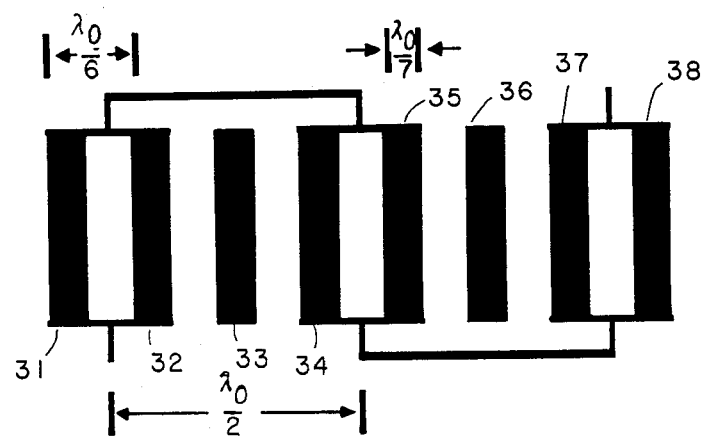

FIGS. 5a–5f show various configurations of MSW output transducers that could be employed in the structure of the invention. FIG. 5a shows a six-sample-per-wavelength transducer, meaning that a single wavelength $\lambda_0$ spans the space between five adjacent parallel electrodes. Moreover, the electrodes are interconnected in such a manner that many harmonics of the $\lambda_0$ signal are cancelled in the transducer. It will be observed that the transducer comprises a total of eight parallel electrodes, indicated by reference numerals 31–38, respectively, and that the inter-electrode spacing is $\lambda_0/6$. Moreover, the first and second electrodes 31 32 are connected in parallel, as are the the fourth and fifth electrodes 34, 35, and the seventh and eight electrodes 37, 38. The three pairs of electrodes 31, 32; 34, 35; and 37, 38 are connected in a series arrangement, but with the middle pair 34, 35 in opposition to the two outer pairs. The third and sixth electrodes 31, 36 are not connected to the others. The effect of these interconnections is to suppress harmonic frequencies of the fundamental signal of wavelength $\lambda_0$. The fifth harmonic is the first clearly nonzero harmonic to be transduced by the output transducer. Moreover, the seventh harmonic will be suppressed by the use of electrode fingers of width $\lambda_0/7$.

Figure 5B:
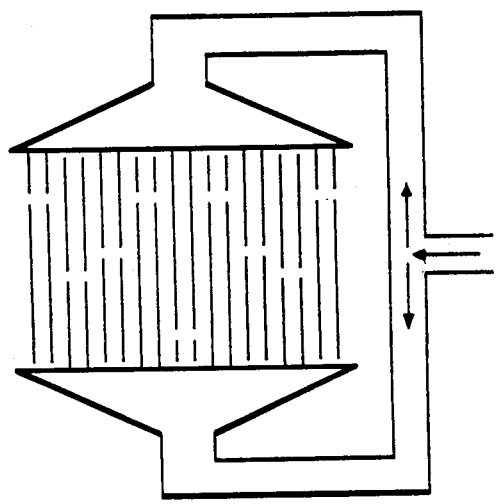

FIGS. 5b-5f are all examples of apodized or weighted MSW transducers. Weighted or apodized transducers use various techniques to vary the degree of coupling or transduction along the length of the transducer. FIG. 5b is an interdigital transducer with four fingers per wavelength, and including "dummy" electrode fingers to maintain uniformity across the transducer aperture. FIG. 5c is an apodized meander line split finger transducer, also including "dummy" fingers to maintain a uniform velocity across the aperture. FIG. 5d is another apodized meander transducer with dummy fingers. FIG. 5e is a simple apodized grating transducer; and FIG. 5f is a simple apodized meander transducer.

The velocity of the magnetostatic waves transmitted between the input and output transducers of the device is approximately two orders of magnitude faster than the velocity of propagation of surface acoustic waves. The frequency of operation of the surface acoustic wave channelizer is limited by the wave velocity and the minimum resolvable photolithographic line width. If the latter is assumed to be the same for MSW devices as for SAW devices, it follows that much higher frequencies of operation can be obtained in the MSW channelizer. The other principal advantage is that the YIG film used as the MSW transmission medium is practically isotropic, which simplifies the design and construction of the device.

It will be appreciated from the foregoing that the present invention represents a significant advance in the field of radio frequency signal processing. In particular, the invention permits the frequency analysis of broadband signals having frequencies well in excess of 1 GHz, without the need for down-converting the input signals to a lower frequency. It will also be appreciated that, although an embodiment of the invention has been described in detail for purposes of illustration, various modifications may be made without departing from the spirit and scope of the invention. Accordingly, the invention is not to be limited except as by the appended claims.

We claim:

1. A magnetostatic wave (MSW) device for processing of multifrequency input signals, the device comprising:
    an MSW propagating medium;
    means for applying a magnetic bias field to the propagating medium;
    input transducer array means responsive to the input signals and providing a spatially modulated transduction coupling strength along an arcuate path on the propagating medium, wherein the arcuate path is selected to provide multiple sources of magnetostatic waves that combine constructively at frequency-dependent points in a focal region of the propagation medium; and
    a plurality of output transducers positioned on the propagating medium at frequency-dependent points in the focal region, to provide output signals indicative of the various frequency components of the input signal.

2. A magnetostatic wave (MSW) device as set forth in claim 1, wherein:
    the input transducer array means includes a microstrip transmission line having alternating high and low impedance sections to provide alternating high and low coupling strength with the propagating medium.

3. A magnetostatic wave (MSW) device as set forth in claim 1, wherein:
    the input transducer array means includes a microstrip transmission line following a meandering path to achieve a spatial modulation of the coupling strength with the propagating medium.

4. A magnetostatic wave (MSW) device as set forth in claim 1, wherein:
    the propagating medium includes a thin film of yttrium-iron-garnet (YIG).

5. A magnetostatic wave (MSW) device as set forth in claim 1, wherein:
    the output transducers include microstrip transmission lines located at the frequency-dependent points in the focal region.

6. A magnetostatic wave (MSW) device for processing of multifrequency input signals to provide multiple outputs indicative of the various frequency components of the input signal, the device comprising:
    an MSW propagating medium;
    means for applying a magnetic bias field to the propagating medium;
    an input transducer array responsive to the input signals and providing a spatially modulated transduction coupling strength along an arcuate path on the propagating medium, wherein the arcuate path is selected to provide multiple sources of magnetostatic waves spaced apart in a wave propagating direction by an integral number of wavelengths at a selected frequency, and wherein the waves from the multiple sources combine constructively at frequency-dependent points in a focal region of the propagation medium; and
    a plurality of output transducers positioned on the propagating medium at frequency-dependent points in the focal region, to provide output signals indicative of the various frequency components of the input signal.

7. A magnetostatic wave (MSW) device as set forth in claim 6, wherein:
    the input transducer array means includes a microstrip transmission line having alternating high and low impedance sections to provide alternating high and low coupling strength with the propagating medium.

8. A magnetostatic wave (MSW) device as set forth in claim 6, wherein:
    the input transducer array means includes a microstrip transmission line following a meandering path to achieve a spatial modulation of the coupling strength with the propagating medium.

9. A magnetostatic wave (MSW) device as set forth in claim 6, wherein:
    the MSW propagating medium includes a thin film of yttrium-iron-garnet (YIG).

10. A magnetostatic wave (MSW) device as set forth in claim 6, wherein:
    the output transducers include sections of microstrip transmission line located at the frequency-dependent points in the focal region.

* * * * *